United States Patent [19]

Natori et al.

[11] Patent Number: 5,012,858

[45] Date of Patent: May 7, 1991

[54] METHOD OF COOLING A SEMICONDUCTOR DEVICE WITH A COOLING UNIT, USING METAL SHERBET BETWEEN THE DEVICE AND THE COOLING UNIT

[75] Inventors: Katsuhide Natori, Yokohama; Isao Watanabe, Sagamihara; Koji Katsuyama, Yokohama; Isao Kawamura, Yokohama; Haruhiko Yamamoto, Yokohama; Takeshi Nagai, Yokohama, all of Japan

[73] Assignee: Fujitsu Limited, Kanagawa, Japan

[21] Appl. No.: 334,770

[22] Filed: Apr. 10, 1989

Related U.S. Application Data

[63] Continuation of Ser. No. 106,842, Oct. 13, 1987, abandoned.

[30] Foreign Application Priority Data

Oct. 20, 1986 [JP] Japan .................................. 61-248801

[51] Int. Cl.$^5$ .......................... H05K 7/20; F28D 21/00
[52] U.S. Cl. .......................... 165/1; 165/185; 165/80.3; 165/80.4; 357/81; 357/82; 420/555; 361/385; 361/386; 361/387
[58] Field of Search ...................... 165/185, 80.3, 80.4, 165/1; 357/81, 82, 66, 67; 420/555, 557; 361/385, 386, 387

[56] References Cited

U.S. PATENT DOCUMENTS

| | | |
|---|---|---|
| 3,852,803 | 3/1974 | Gec . |
| 4,446,916 | 8/1984 | Hays . |
| 4,639,829 | 1/1987 | Ostergren et al. ............... 165/185 X |
| 4,649,990 | 3/1987 | Kurihara et al. ............... 165/185 X |
| 4,682,566 | 7/1987 | Aitken ........................... 165/80.4 X |
| 4,729,060 | 3/1988 | Yamamoto et al. .............. 357/82 X |
| 4,879,632 | 11/1989 | Yamamoto et al. ................. 165/185 |

FOREIGN PATENT DOCUMENTS 0032178 7/1981 European Pat. Off. .
58-196041 11/1983 Japan .

OTHER PUBLICATIONS

W. J. Kleinfelder et al., "Liquid-Filled Bellows Heat Sink", vol. 21, No. 10, Mar. 1979, p. 4125, IBM Technical Disclosure Bulletin.

J. K. Hassan et al., "Chip Cooling Employing a Conformable Alloy", vol. 24, No. 11A, Apr. 1982, p. 5595, IBM Technical Disclosure Bulletin.

Primary Examiner—Carl D. Price
Attorney, Agent, or Firm—Armstrong, Nikaido, Marmelstein, Kubovcik & Murray

[57] ABSTRACT

A method of cooling a semiconductor device with a cooling unit, using a metal sherbet, which is metal being in a state of a mixed phase consisting of a liquid phase and a solid phase, as a heat conducting body put between the cooling unit and the semiconductor device for transferring heat generated in the semiconductor device to the cooling unit. The metal sherbet is metal, such as In-Ga binary system, in which solids of In-Ga solid solution are dispersed in an In and Ga liquid at a temperature obtained under normal operations of the semiconductor device and the cooling unit.

3 Claims, 4 Drawing Sheets

METHOD OF COOLING A SEMICONDUCTOR DEVICE WITH A COOLING UNIT, USING METAL SHERBET BETWEEN THE DEVICE AND THE COOLING UNIT

This application is a continuation of application Ser. No. 106,842 filed Oct. 13, 1987, now abandoned.

BACKGROUND OF THE INVENTION

The present invention relates to a cooling method for a semiconductor device, and more particularly, to a cooling method of using a metal sherbet, consisting of metal being in a state of a mixed phase of a liquid phase and a solid phase, as a heat conducting body put between a cooling unit and the semiconductor device for transferring heat generated by the semiconductor device to the cooling unit in high cooling efficiency.

Recently, to improve processing ability of an information processing system, respective sizes of the transistor devices used in the system have become extremely miniaturized. Accordingly, each size of elements of the semiconductor device is extremely miniaturized, in other words, a number of electronic elements mounted on the semiconductor device is tremendously increased as seen in an advanced semiconductor device such as an LSI (Large Scale Integration) device and a VLSI (Very Large Scale Integration) device. However, realizing thus a further reduction in size of the semiconductor device, in other words, realizing a higher packing density of the semiconductor device results in generating a large amount of heat from the semiconductor device. Accordingly, it has become impossible to keep an operating temperature of the semiconductor device in a maximum allowable in use, as long as a conventional air cooling method is used for cooling the semiconductor device. Namely, the heating value per second of an LSI device is, for example, about 4 watts even in a maximum, and it increases up to as much as 10 watts in case of a VLSI device. Therefore, to cool the semiconductor device, it has become necessary to employ a liquid cooling method in place of the conventional air cooling method.

Many kinds of liquid cooling units or structure have been practically used. For instance, FIG. 1 is a liquid cooling unit used for a flat package type semiconductor device, and FIG. 2 is liquid cooling structure used for a flip chip type semiconductor device. These liquid cooling unit and structure may be applied to any other types of semiconductor devices.

FIG. 1 indicates a mounting state of a liquid cooling unit 6 onto a flat package type semiconductor device 2 through an elastic heat conducting body 4 and a heat transferring plate 3 (made of, for example, alumina) equipped with the flat package type semiconductor device 2. The liquid cooling unit 6 comprises a cooling body 1, a bellows 5 made of metal or plastic, a heat conducting plate 9 connected to the bellows 5, a nozzle 7 and a water drain port 8. The heat conducting plate 9 is thermally connected with the heat transferring plate 3 through the elastic heat conducting body 4.

In FIG. 1, the nozzle 7 ejects cooling water into a chamber formed by the bellows 5 for cooling the heat conducting plate 9 so that heat generated by the flat package type semiconductor device 2 is transferred to the cooling body 1, then the ejected cooling water ejected into the chamber flows out from the water drain port 8 transferring heat from the heat conducting plate 9. Usually, the cooling temperature can be controlled by changing the temperature of the cooling water.

The elastic heat conducting body 4 is made of silicon rubber, in which ceramic powder is mixed, for making the elastic heat conducting body 4 have an excellent heat conducting characteristic and good contact with both the heat conducting plate 9 and the heat transferring plate 3, using a pressure due to the elasticity of the bellows 5.

FIG. 2 indicates structure of cooling a flip chip type semiconductor device 10 by utilizing a metal block (made of, for example, aluminum) 11 cooled by a cooling unit 13 which is also cooled by coolant flowing through a plurality of pipes 12 passing through the cooling unit 13. The cooling unit 13 has a recessed portion into which the metal block 11 is inserted pushing a coil spring 14. The metal block 11 has high heat conductivity and a smooth surface for making good contact with an inner wall surface of the recessed portion. The coil spring 14 is used to allow the metal block 11 to be placed in sufficient contact with the semiconductor device 10, with uniform pressure. The heat generated by the semiconductor device 10 is transferred to the cooling unit 13 through the metal block 11. The heat resistance appearing in gaps between the semiconductor device 10 and the metal block 11 and between the metal block 11 and inner wall surface of the cooling unit 13 is reduced by using gas, such as helium having good heat conduction, filled in the gaps and a space 20.

Many kinds of liquid cooling units have been used elsewhere, however considerably high heat resistance appears between the semiconductor device and the liquid cooling unit. Accordingly, in the prior art, the following methods have been proposed to lower the heat resistance:

(1) depositing soft metal (for example, indium or an indium alloy) into a contact portion intended to be thermally contacted with pressure;

(2) providing a liquid metal (for example, mercury) to the contact portion; and (3) soldering the contact portion.

However, in the method (1), high thermal conductivity is hard to be obtained because the air layer always exists at a gap appearing in the contact portion. In the method 2, there is always fear of occurrence of short-circuit caused by flow of the liquid metal, because the liquid metal has low viscosity. In the method 3, a stress due to a difference of thermal expansion produced among the solder, the semiconductor device and the liquid cooling unit happens to occur, so that connecting structure around the contact portion is easy to be cracked when operation and cooling is frequently performed.

Thus, the liquid cooling method is effective for cooling the semiconductor device, compared with the air cooling method, however, still has a problem that a sufficient cooling effect is hard to be obtained because of large heat resistance appearing between the semiconductor device and the cooling unit, which has been a problem in the prior art.

SUMMARY OF THE INVENTION

An object of the present invention is to improve cooling effect of a semiconductor device such as an LSI and a VLSI device.

Another object of the present invention is to increase a packing density of the semiconductor device for realizing further accelerated development of the semiconductor devices.

Still another object of the present invention is to contribute for realizing higher operating reliability of the semiconductor devices.

Above objects of the present invention can be attained by employing a cooling method in which "metal sherbet" is used for a heat conducting body put between a cooling unit and the semiconductor device. Wherein, the metal sherbet is metal being in a mixing state of a solid phase and a liquid phase, such as, a mixture consisting of indium (In) and gallium (Ga).

In case of a binary system of Ga and In, when a weight percent of In is in a particular range, two-phase mixture exists in a state of a highly viscous sherbet in which solids are dispersed in a liquid. In the present invention, such two-phase mixture is used as the heat conducting body.

In accordance with applying the metal sherbet to the heat conducting body, a sufficient thermal contact between the semiconductor device and the cooling unit can be realized without using so much pressure, and very high cooling efficiency can be obtained because heat conductivity of the metal sherbet is excellent. That is, the heat resistance of the prior art (2.5° C./watt), in which the silicon rubber has been used, is improved to half by applying the present invention.

DESCRIPTION OF THE PREFERRED EMBODIMENTS

Figure 2:
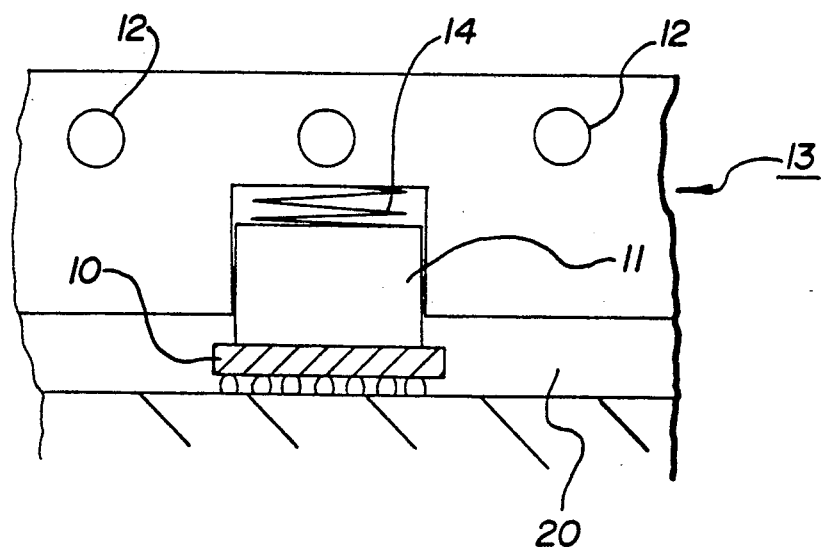
FIG. 2 is a sectional view of explaining the conventional liquid cooling unit for a flip chip type semiconductor device.

The present invention is adopted to cool a flip chip type semiconductor device shown in FIG. 2.

Figure 3A:
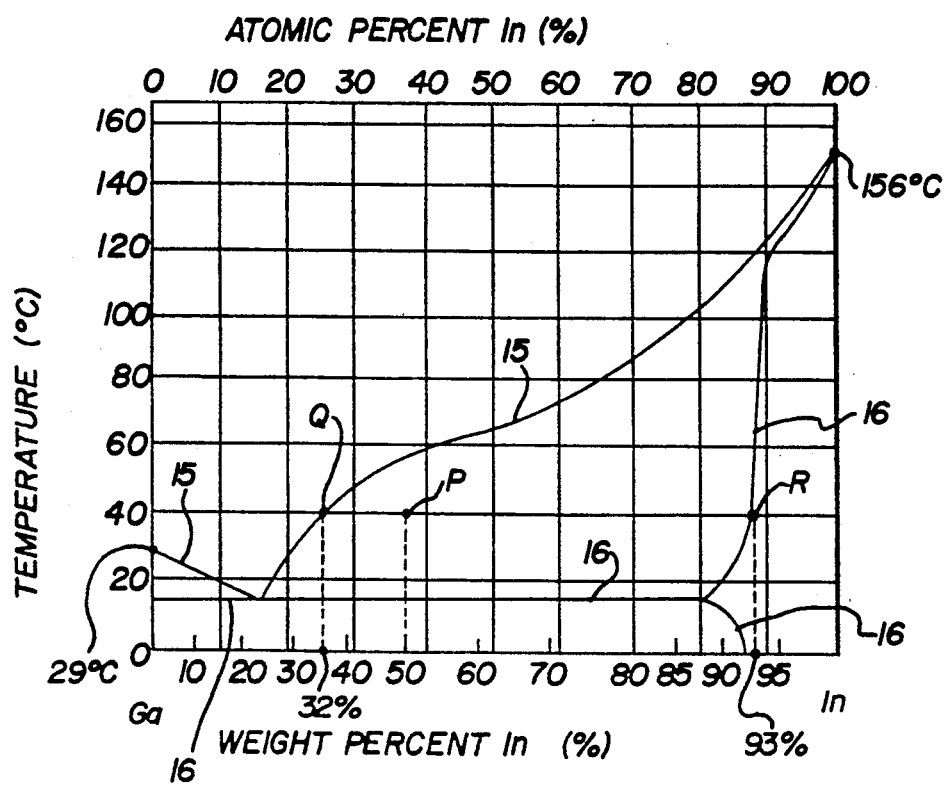
FIG. 3(a) is a phase diagram of an In-Ga binary system relating to the present invention.

FIG. 3(a) is a phase diagram of an In-Ga binary system. As indicated in the diagram, the melting point of In is approximately 156° C. and the melting point of Ga is approximately 29° C. In this system, a mixed phase, related to the present invention, of a liquid phase and a solid phase lies within a range of 24.5%–88% (weight percent) or 16.3%–81.7% (atomic percent) of In. Namely, the mixed phase region, in other words, a metal sherbet region in this disclosure, corresponds to a region enclosed by a liquidus line 15 and a solidus line 16. This metal sherbet region is well known to those skilled in the art, and particularly in academia, as the "two-phase field of liquid and solid". For instance, when the In-Ga binary system includes 50 weight percent of In under 40° C. of the temperature of the system, a point P is obtained in the sherbet region, points Q and R are obtained respectively by intersecting an X coordinate of 40° C. with the lines 15 and 16. Wherein, the point P indicates a total composition, R indicates the composition of a solid of In-Ga solid solution (which will be called simply "solid solution" hereinafter) and Q indicates the composition of an In and Ga liquid. From such points P, Q and R, it can be said that this system has a component ratio of a solid to a liquid is equal to a ratio of length P-Q to P-R. When the semiconductor device normally operates under a normally cooled condition, the metal sherbet has a temperature at which the metal sherbet comes to be in a state that the In-Ga solid solution is dispersed in an In and Ga liquid. A ratio of the In-Ga solid solution to the In and Ga liquid depends on a component ratio of In to Ga and temperature of the In-Ga binary system, and a composition ratio of In to Ga in the In-Ga solid solution depends on the temperature. For instance, in FIG. 3(a), when the In weight percent decreases, an amount of dispersed In-Ga solid solution decreases, in other words, an amount of the In and Ga liquid increases.

Considering temperature rise of the semiconductor device which normally operates under a normally cooled condition, a temperature range from 40° C. to 90° C. is enough for obtaining the metal sherbet in the In-Ga binary system. Incidentally, in FIG. 3(a), the line of 40° C. intersects with the lines 15 and 16 at the points Q and R respectively as mentioned before, and the In weight percent at the point Q is 32% and that at the point R is 93%.

Figure 4:
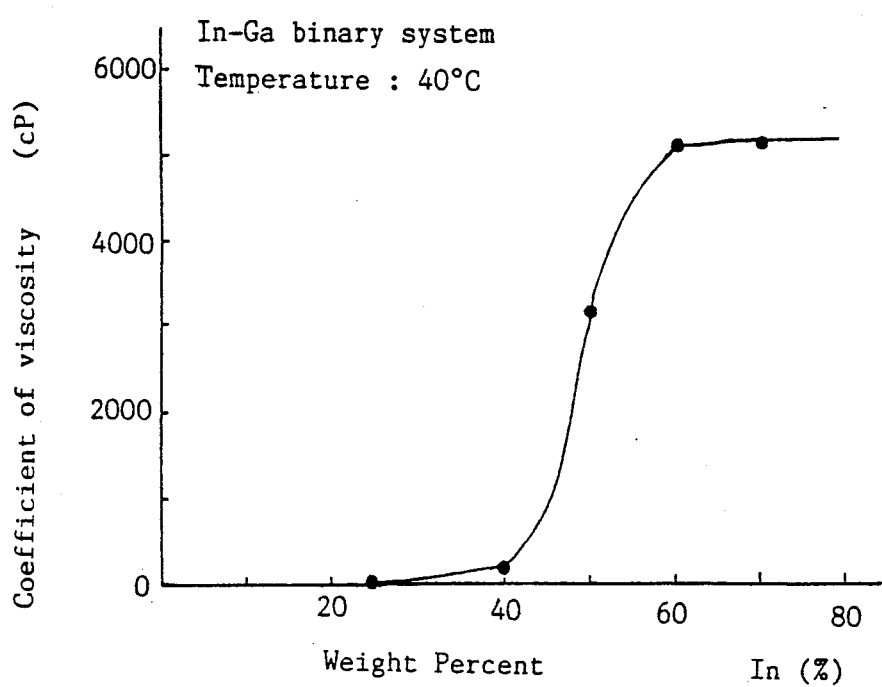
FIG. 4 is a graph indicating relation between weight percent of In and viscosity of an In-Ga binary system in the In-Ga binary system relating to the present invention.

FIG. 4 shows relation between the In weight percent and an In viscosity (unit: centipoise or cP) in the In-Ga binary system at the temperature of 40° C.; wherein, the viscosity is measured by a B type viscosimeter. From this figure, it will be understood that the viscosity is 3,000 cP or more when more than 50% weight percent of In is included in the In-Ga binary system.

To achieve the present invention, it is preferable that the viscosity of the metal sherbet is more than 3,000 cP for avoiding the metal sherbet flying out due to, for example, mechanical vibration.

Generally, the temperature of the semiconductor device rises more than 40° C. in normal operation, so that, as shown in FIG. 4, the weight percent of In must be more than 50 for obtaining the viscosity of more than 3,000 cP. Meanwhile, since the maximum allowable temperature of semiconductor device is approximately 80° C. in operation, the weight percent of In must be less than 94, as shown in FIG. 4. From the above, for forming the mixture of the In-Ga solid solution and the In and Ga liquid, it can be concluded that the composition of In in the In-Ga binary system is within 50 to 94 weight percents.

Figure 5A:
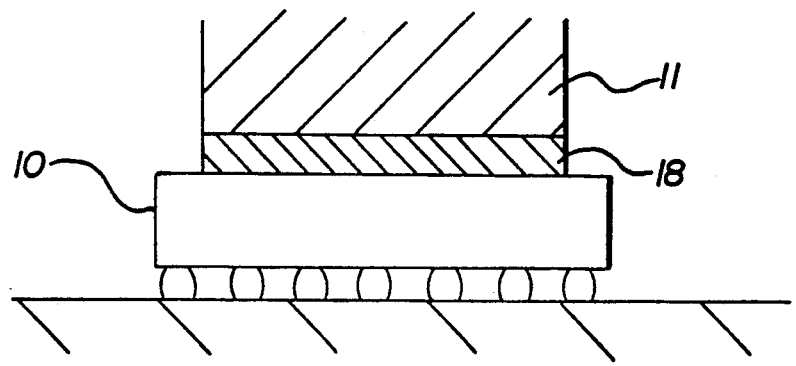
FIG. 5(a) is a sectional view of a flip chip type semiconductor device where a metal sherbet embodying the present invention is used.

FIG. 5(a) is a sectional view of a flip chip type semiconductor device using the metal sherbet of the present invention as the heat conducting body. The FIG. 5(a) corresponds to the prior art cooling structure shown in FIG. 2, and the same reference numerals as in FIG. 2 designate the same device or parts as in FIG. 2.

In FIG. 5(a), the semiconductor device 10 and the metal block 11 are thermally connected through a metal sherbet 18 having a high viscosity at a temperature obtained under normal operation of the semiconductor device 10 and the cooling unit 11. In this embodiment, the In-Ga binary system, having 80% weight percent of In, is used as the metal sherbet. The above In-Ga binary system shows a two-phase (solid and liquid phases) mixture in a temperature range of 15.7° C.-88° C. Applying such metal sherbet 18 to the heat conducting body, a sufficient heat connection can be obtained and no fear of the short circuit due to lowered viscosity of a heat conducting body occurs, and, furthermore, lowering the thermal resistance can be realized in the same way as being performed by the usual soldering.

Figure 1:
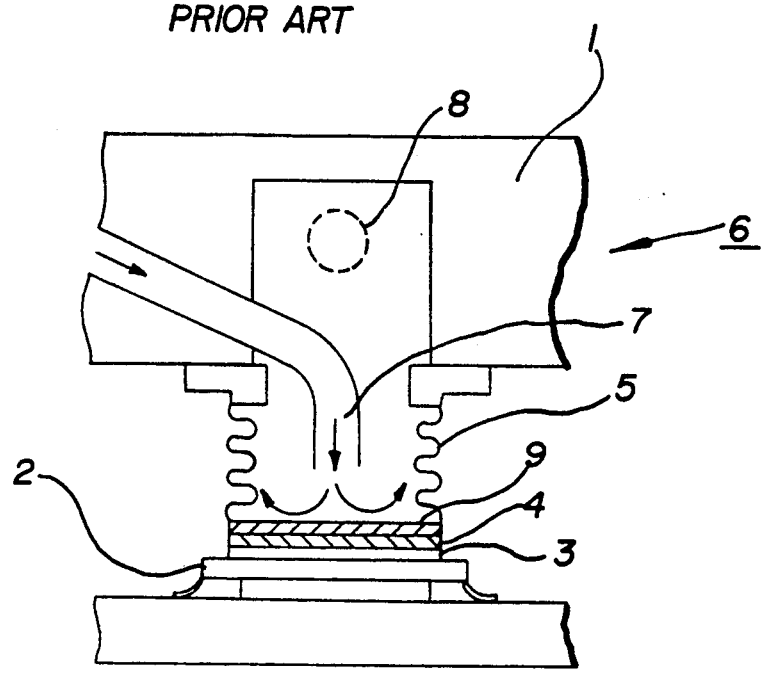
FIG. 1 is a sectional view of explaining a conventional liquid cooling unit for a flat package type semiconductor device.
Figure 5B:
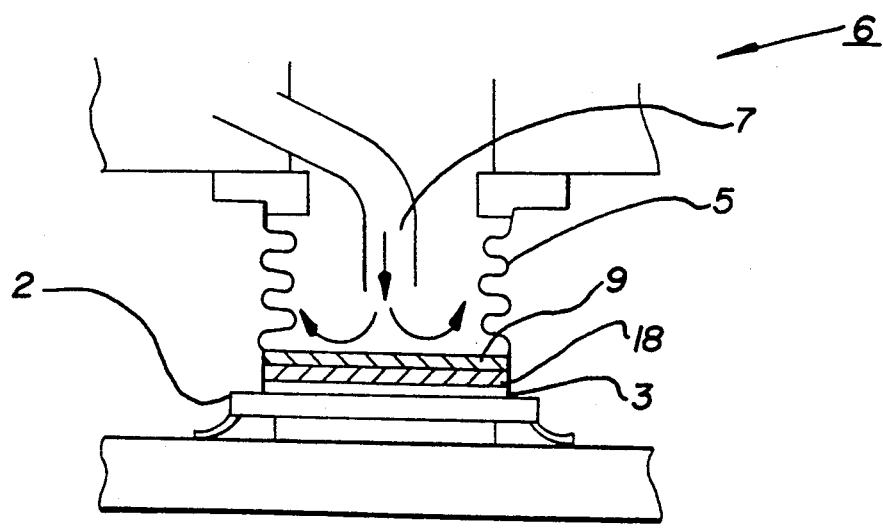
FIG. 5(b) is a sectional view of a flat package type semiconductor device where a metal sherbet embodying the present invention is used.

FIG. 5(b) is a sectional view where a flat package type semiconductor device 2 is cooled by using a liquid cooling unit 6 connected to the device 2 by using a metal sherbet 18 of the present invention as the heat conducting body. This structure corresponds to the conventional structure indicated in FIG. 1, and the same reference numerals as in FIG. 1 designate the same unit or parts as in FIG. 1.

In FIG. 5(b), the connection between the heat transferring plate 3 attached to the flat package type semiconductor device 2 and the heat conducting plate 9 of the liquid cooling unit 6 having the bellows 5 is realized by using a metal sherbet 18 having a high viscosity at an operating temperature of the semiconductor device 2. The heat connection between the heat transferring plate 3 and the heat conducting plate 9 by the metal sherbet 18 can be perfectly performed as stated in the explanation referring to FIG. 5(a), so that there is no fear of short-circuit due to flow and leak from a heat conducting body having low viscosity, and thermal resistance also can be lowered.

As the other embodiment, a Ga-Sn binary system can be used as a heat conducting body. In the Ga-Sn binary system, when the weight percent of Sn is designated to 20% -60%, effect same as obtained in case of the In-Ga binary system can be confirmed.

Figure 3B:
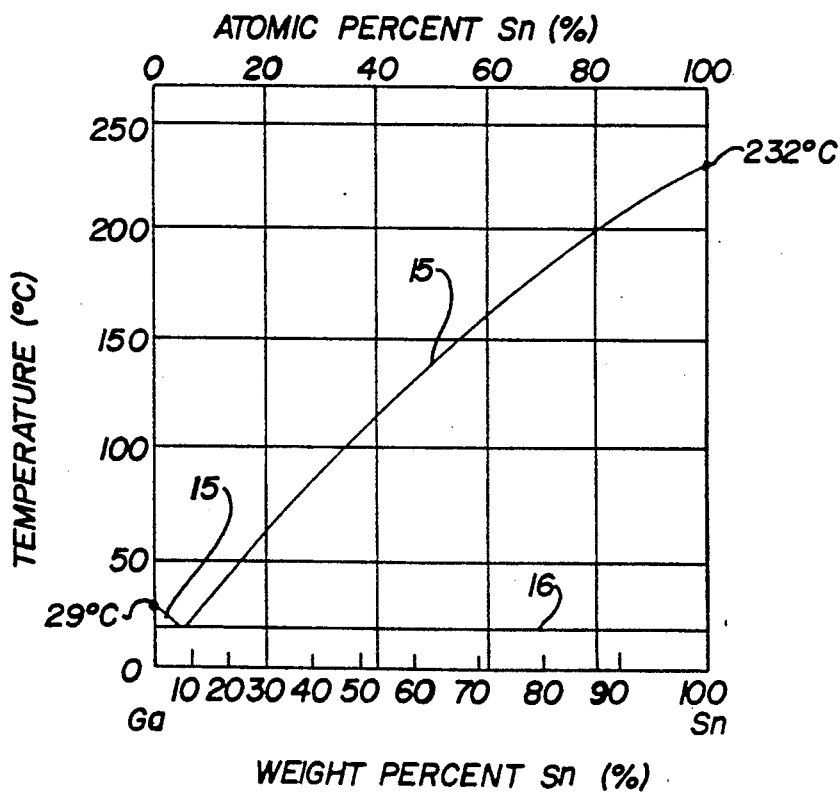
FIG. 3(b) is a phase diagram of a Ga-Sn binary system relating to the present invention.

FIG. 3(b) is a phase diagram of the Ga-Sn binary system. As indicated in the figure, a melting point of Sn is approximately 232° C. and a melting point of Ga is approximately 29° C. In FIG. 3(b), the region enclosed by a liquidus line 15 and a solidus line 16 is a metal sherbet region. In this metal sherbet region, the solids of Ga-Sn solid solution (which will be called "Ga-Sn solid solution" hereinafter) are dispersed in a Ga and Sn liquid so that a ratio of the Ga-Sn solid solution to the Ga and Sn liquid and a composition ratio of Ga to Sn depend on a component ratio of Ga to Sn in the metal sherbet and the temperature of the metal sherbet.

Relationship between weight percent of Sn and viscosity (cP), which is measured by the B type viscosimeter, in the Ga-Sn binary system can be obtained similarly to the case of the In-Ga binary system shown in FIG. 4. When the weight percent of Sn is 20%-60% (more desirably 30%-45%) and that of Ga is 80%-40% (more desirably 70%-55%), the same effect as obtained in case of the In-Ga binary system can be obtained. That is, if the weight percent of Sn is less than 20%, a temperature range for allowing the Ga-Sn binary system to have a state of the mixture phase becomes narrow, and if the weight percent on Sn is more than 60%, the viscosity of the Ga-Sn binary system (metal sherbet) becomes so large that it would be hard to form the metal sherbet so as to uniformly attach to the metal block 11 and the semiconductor device 10 in case of cooling the flip chip type semiconductor device 10 as shown in FIG. 5(a) and to the heat transferring plate 3 and the heat conducting plate 9 in case of cooling flat package type semiconductor device as shown in FIG. 5(b).

In each of the phase diagrams (FIGS. 3(a) and 3(b)), it is preferable that a temperature difference between the liquidus line and the solidus line is large, because, in such case, a usage temperature range for the heat conducting body can be widened.

In FIGS. 5(a) and 5(b), the metal sherbet for the heat conducting body 18 is actually put by the following steps, when, for example, the In-Ga binary system is applied to the heat conducting body 18: (1) providing a first In-Ga solid solution having, for example, 75.5% (weight) of Ga and 25.5% (weight) of In; wherein, the first In-Ga solid solution is in a liquid phase at a room temperature; (2) wetting the surfaces, to be connected, of the semiconductor device and the cooling unit with the first In-Ga solid solution; (3) providing a second In-Ga solid solution which is what invented and in a state of mixture phase when its temperature rises up to, for example, 40° C.; wherein, the temperature 40° C. is decided by considering a cooling condition of the semiconductor device; (4) putting the semiconductor device and the cooling unit in an atmosphere having a temperature of 40° C.; (5) dropping a proper amount of the second In-Ga solid solution on the wet surfaces of the semiconductor device and the cooling unit, so that the drop of the invented In-Ga solid solution is naturally spread over the surfaces; (6) connecting the both surfaces to each other; and (7) taking the semiconductor device and the cooling unit, connected to each other, out from the atmosphere and putting an normal atmosphere having a room temperature.

Thus, the In-Ga and Ga-Sn binary systems are used as the metal sherbet, however the multinary metal system such as ternary system substantially including respectively In and Ga or Ga and Sn can also be considered as the metal sherbet.

Not only to the flat package type semiconductor device or the flip chip type one but also to other type semiconductor devices, the cooling method of the present invention can be applied as long as a liquid cooling unit is used, and the cooling method of the present invention can also be applied to other liquid cooling system for cooling devices other than the semiconductor devices.

What is claimed is:

1. In a method for cooling a semiconductor device using heat transfer means, the improvement comprising the use of a heat conducting body disposed between said semiconductor device and said heat transfer means, said heat conducting body being an alloy which is in the state of a two-phase field of liquid and solid uniformly throughout the body when the semiconductor device is at operating temperature and having a coefficient of viscosity greater than 3,000 centipoise at a temperature less than 40° C.

2. A method according to claim 1, wherein said heat conducting body consists essentially of 50-94 weight % indium and 6-50 weight % gallium.

3. A method according to claim 1, wherein said heat conducting body consists essentially of 20-60 weight % tin and 40-80 weight % gallium.

* * * * *